United States Patent
Tan et al.

(10) Patent No.: US 6,233,594 B1
(45) Date of Patent: May 15, 2001

(54) DECIMATION FILTER FOR OVERSAMPLING ANALOG-TO DIGITAL CONVERTER

(75) Inventors: Nianxiong Tan, Eatontown; Peter D. Keller, Tinton Falls, both of NJ (US)

(73) Assignee: Globespan, Inc., Red Bank, NJ (US)

( * ) Notice: Subject to any disclaimer, the term of this patent is extended or adjusted under 35 U.S.C. 154(b) by 0 days.

(21) Appl. No.: 09/175,886

(22) Filed: Oct. 20, 1998

Related U.S. Application Data

(60) Provisional application No. 60/101,468, filed on Sep. 23, 1998.

(51) Int. Cl.[7] .................................................. G06F 17/17
(52) U.S. Cl. .................................................................. 708/313
(58) Field of Search ................................. 708/313, 319, 708/320; 341/61

(56) References Cited

U.S. PATENT DOCUMENTS

| | | | |
|---|---|---|---|
| 4,344,149 | 8/1982 | van de Meeberg et al. | 364/724 |
| 4,872,129 * | 10/1989 | Preifer et al. | 708/313 |
| 5,157,395 | 10/1992 | Del Signore et al. | 341/143 |
| 5,446,917 | 8/1995 | Krisciunas et al. | 395/800 |
| 5,617,344 | 4/1997 | Young et al. | 364/724.1 |
| 5,621,675 | 4/1997 | Linz et al. | 364/724.1 |
| 5,689,449 * | 11/1997 | Saramäki et al. | 708/313 |
| 5,835,390 * | 11/1998 | Trager | 708/313 |

* cited by examiner

Primary Examiner—Tan V. Mai
(74) Attorney, Agent, or Firm—Thomas, Kayden, Horstemeyer & Risley

(57) ABSTRACT

The disclosure is generally directed to an improved structure for a decimation filter. More specifically, the disclosure includes a method and apparatus for decimating an oversampled signal at the input, which is the output of an oversampling analog-to-digital converter. In accordance with one aspect of the system, an apparatus is provided for decimating an oversampled signal. The apparatus includes at least one non-recursive decimator. Specifically, the at least one non-recursive decimator is configured to receive the oversampled input signal defined by a first sampling frequency. This at least one non-recursive decimator is further configured to generate a output having a second sampling frequency. The apparatus further includes a recursive decimator. The recursive decimator is configured to receive the output of the at least one non-recursive decimator and generate an output having third sampling frequency. It will be appreciated that the second sampling frequency output from the non-recursive decimator is less than the sampling frequency of the oversampled input signal, and further that the third sampling frequency is less that the second sampling frequency. In accordance with another aspect of the disclosure, a method is provided for decimating an oversampled signal. Broadly, the method includes the steps of decimating the oversampled signal in accordance with a non-recursive decimation algorithm to generate an interim decimated signal, and decimating the interim decimated signal in accordance with a recursive decimation algorithm to generate a final decimated signal.

17 Claims, 2 Drawing Sheets

DECIMATION FILTER FOR OVERSAMPLING ANALOG-TO DIGITAL CONVERTER

CROSS-REFERENCE TO RELATED APPLICATIONS

The application claims the benefit of U.S. Provisional Application entitled "Decimation Filter Design for OSADC", filed Sep. 23, 1998, and assigned Ser. No. 60/101,468.

BACKGROUND OF INVENTION

1. Field of the Invention

The present invention generally relates to analog-to-digital converters, and more particularly to an improved decimation filter for use with an oversampling analog-to-digital converter.

2. Discussion of the Related Art

As is known, oversampling analog-to-digital converters (ADCs) generally consist of two parts: an analog modulator and a digital filter. The analog modulator receives an analog signal and produces a serial data stream having a bit rate which is much greater than the Nyquist sampling frequency. The quantization noise of the analog modulator is shaped to minimize the noise in the passband of interest, at the expense of higher noise outside of this passband. This is as opposed to distributing the noise evenly between DC and the modulator sampling frequency. The digital filter portion of the ADC is operable to filter and decimate the modulator representation of the analog input. Since the modulator quantization noise is shaped, the digital filter must filter this out-of-band quantization noise and reduce the output word frequency to twice the effective Nyquist frequency. Decimation is a well-known technique that is utilized in most oversampling ADCs.

In some applications utilizing decimation, the output sampling rate must be set at one of a plurality of sampling rates. In order to provide for these different sampling rates, an ADC needs to have the ability to select one of a plurality of decimation rates to provide the selected output sampling rate. This must either be done by providing a plurality of ADCs with fixed and separate decimation rates or to perform some control of the digital filter to effect a variable decimation rate architecture.

Conventional digital filters in ADCs utilize some form of digital signal processor utilizing multiple stages of digital filtering. These stages of digital filtering typically utilize a finite impulse response (FIR) or infinite impulse response (IIR) filter topology which requires at minimum a multiplier and an accumulator and stored filter coefficients that define the transfer function of the filter. The data is processed with the multiplier and accumulator utilizing the stored filter coefficients. Each set of filter coefficients is designed to provide a specific decimation rate and filter transfer function. In order to provide a variable decimation rate, it is necessary to process data through multiple filter stages with the number of filter stages varied. With conventional digital filter processors having unlimited processing power, select filter topologies and the order thereof can be realized. However, an ADC that is incorporated into an integrated circuit has limited silicon real estate and limited power budget available and, therefore, incorporating the full power of a digital signal processor is not feasible. Typically, oversampling ADCs have utilized a fixed decimation architecture (usually sinc or comb filter architecture) to realize a desired filter transfer function.

A decimation filter is arranged to reduce the sampling frequency of a digital information signal such that no aliasing occurs. Various structures and embodiments of decimation filters are known. The common practice is to use a sinc or comb filter due to its simplicity and efficiency. The transfer function of sinc filter is defined by equation 1.

$$H(z) = \left\{\frac{1-z^{-N}}{1-z^{-1}}\right\}^k = \left\{\sum_{i=0}^{N-1} z^{-i}\right\}^k, \quad \text{(Equation 1)}$$

where N is the decimation ratio and k is the order of the sinc filter. A scaling factor may also be included in the algorithm to facilitate the hardware implementation.

The order of the sinc filter should be one order higher than the delta-sigma modulator in order to filter out the spectrally shaped quantization noise. The decimation ratio is usually chosen to be one-fourth of the total decimation ratio (or oversampling ratio OSR) due to the consideration of the attenuation at the upper end of the passband. Further decimation by a factor of four can be done by an ordinary filter since the data rate is already greatly reduced. This arrangement represents an adequate trade-off, considering the complexity and the compensation for the droop due to the sinc filter. Usually, the sinc filter consumes a relatively large amount of power, due to the high data rate and the FIR filter is relatively less power consuming due to the reduced data rate, in spite of the increased complexity. In some applications, the attenuation at the upper end of the passband is acceptable, we can exclusively use sinc filer for decimation. For example, FIG. 1 is a block diagram that depicts a well-known structure of a decimation filter. Due to the high input data rate, the decimation filter uses a sinc function as a first stage, followed by a FIR filter.

As is also known, various manners and structures are known to realize this sinc filter. One way of implementing the function of Equation 1 is through the use of a look-up table. More specifically, a memory device, such as a ROM, may be used to store the coefficients to perform a direct convolution. This manner of implementation, however, is costly to implement, in that it demands a relatively large amount of chip area, especially when N and k are large. Another related manner of implementing the function of Equation 1 is to perform direct convolution by using an up/down counter to generate the coefficients, rather than storing them in a ROM to save chip area. However, under this approach, power consumption is relatively large due to the high data rate of operation.

A more popular architecture for realizing the sinc (decimation) filter utilizes a recursive, infinite impulse response (IIR) filter in connection with an FIR filter. A structure realizing this is shown in FIG. 2. The IIR portion operates at the oversampling frequency. After the IIR portion, the data rate is reduced by a factor of N, and therefore the FIR portion operates at the decimated frequency. Rearranging Equation I yields the Equation 2 below:

$$H(z) = \left\{\frac{1-z^{-N}}{1-z^{-1}}\right\}^k = \left\{\frac{1}{1-z^{-1}}\right\}^k \cdot \{1-z^{-N}\}^k. \quad \text{(Equation 2)}$$

As will be appreciated from Equation 2, the IIR portion of the equation has multiple poles on the unit circle, and is therefore unstable. A residue algorithm must be applied in order to achieve proper operation, which implies only the residue needs to be stored and the accumulation may overflow. To preserve the accuracy, the data length stored in the registers of the IIR portion must be no less than m+k·log₂N, where m is the input data length. It will be appreciated that many operations must be performed at the highest data rate, resulting in a relatively large power consumption. In addition, the recursive loop limits the overall speed of operation.

Another embodiment for implementing the sinc filter function filter is through the use of a non-recursive architecture, as illustrated in FIG. 3. Assuming that $N=2^M$, then the transfer function becomes:

$$H(z) = \left\{\frac{1-z^{-N}}{1-z^{-1}}\right\}^k = \prod_{i=0}^{M-1}\{1+z^{-2^i}\}^k. \quad \text{(Equation 3)}$$

A significant advantage of the non-recursive architecture is that data rate decreases stage by stage. Although the data rate is high, the data length is relatively short. At high data rates, only the simple FIR filtering with short data length is performed. This results in considerable increase in speed and decreases the power dissipation. However, the non-recursive architecture of FIG. 3 requires a decimation ratio that is a power of two, since each stage decimates by a factor of two. This also limits the programmable flexibility of the filter design. Another drawback of this technique is the chip area when a large decimation ratio is required. It is seen in FIG. 3 that when we increase the decimation ration by a factor of 2, we need one more stage to realize it. Since at the later stages, the data length is increased, the chip area increases significantly though the increase in power consumption is negligible due to the low clock frequency.

Accordingly, there is a need to provide an improved decimation filter that overcomes the foregoing and other shortcomings of the prior art.

SUMMARY OF INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the advantages and novel features, the present invention is generally directed to an improved structure for a decimation filter. More specifically, the invention comprises a method and apparatus for decimating an oversampled signal at the input. In accordance with one aspect of the invention, an apparatus is provided for decimating an oversampled signal. The apparatus comprises at least one non-recursive decimator. Specifically, the at least one non-recursive decimator is configured to receive the oversampled input signal defined by a first sampling frequency. This at least one non-recursive decimator is further configured to generate an output having a second sampling frequency. The apparatus further includes a recursive decimator. The recursive decimator is configured to receive the output of the at least one non-recursive decimator and generate an output having third sampling frequency. It will be appreciated that the second sampling frequency output from the non-recursive decimator is less than the sampling frequency of the oversampled input signal, and further that the third sampling frequency is less that the second sampling frequency.

In accordance with the preferred embodiment of the present invention, the non-recursive decimators can be realized by cascading the first-order function $1+z^{-1}$ at the front end of the apparatus. The output of the last of these cascaded decimators is then input to a recursive decimator. Indeed, in accordance with the preferred embodiment of the present invention, five first-order functions are cascaded at the front end of the apparatus, and therefore the non-recursive decimators are defined by the following equation: $(1+z^{-1})^5$, where $z^{-1}$ represents a delay. If there are k first-order functions, the overall decimation (performed by the non-recursive decimators) is defined by the equation: $(1+z^{-1})^k$, where k is the number of cascaded stages of the first-order function $(1+z^{-1})$. Or equivalently, this cascade realization can be replaced by an expansion of the FIR filter, for example $(1+z^{-1})^5=1+5z^{-1}+10z^{-2}+10z^{-3}+z^{-5}$. This can also be directly implemented by delays and summations (the multiplication can be realized by shifting and adding).

Consistent with the broad concepts and teachings of the present invention, non-identical, non-recursive decimators may be cascaded at the front end of the apparatus, depending upon design goals and the particular application.

In accordance with the preferred embodiment of the invention, the recursive decimator is defined by the Equation 2 where the clock frequency and decimation ratio is already reduced by the up-front non-recursive FIR filter. Accordingly, the overall decimation performed by the apparatus of the preferred embodiment (employing $M_n$ identical non-recursive decimators) is defined by the equation:

$$H(z) = \left\{\prod_{i=0}^{M_n-1}\{1+z^{-2^i}\}^k\right\} \cdot \left\{\frac{1}{1-(z^{-2^{M_n}})}\right\} \cdot \left\{1-(z^{-2^{M_n}})^{M_r}\right\}^k. \quad \text{(Equation 4)}$$

In accordance with another aspect of the present invention, a method is provided for decimating an oversampled signal. Broadly, the method includes the steps of decimating the oversampled signal in accordance with a non-recursive decimation algorithm to generate an interim decimated signal, and decimating the interim decimated signal in accordance with a recursive decimation algorithm to generate a final decimated signal. In accordance with the preferred embodiment, the method repeats the first step of decimating the oversampled signal in accordance with a non-recursive decimation algorithm a predetermined number of times, before executing the step of decimating the interim decimated signal in accordance with a recursive decimation algorithm.

BRIEF DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Figure 1:
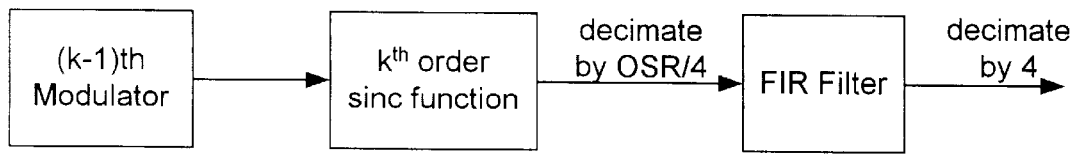
FIG. 1 is a block diagram depicting the general structure of a decimation filter as is known in the prior art.
Figure 2:
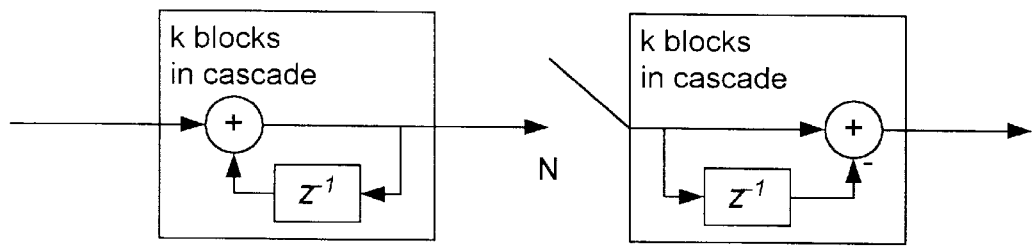
FIG. 2 is a block diagram illustrating a recursive type of decimation filter, as is known in the prior art.
Figure 3:
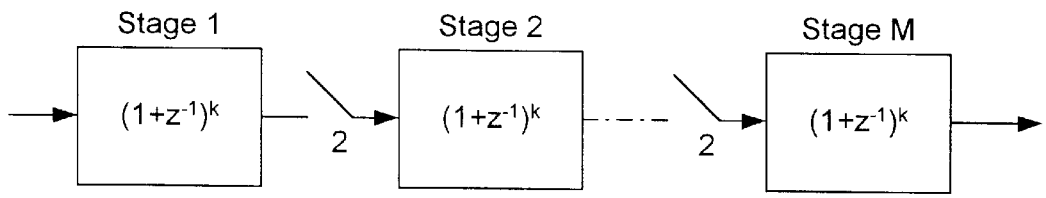
FIG. 3 is a block diagram illustrating a non-recursive type of decimation filter, as is known in the prior art.

Having summarized the invention above, reference will now be made in detail to the description of the invention as illustrated in the drawings. While the invention will be described in connection with these drawings, there is no intent to limit the invention to the embodiment or embodiments disclosed therein. On the contrary, the intent is to cover all alternatives, modifications and equivalents included within the spirit and scope of the invention as defined by the appended claims.

Figure 4:
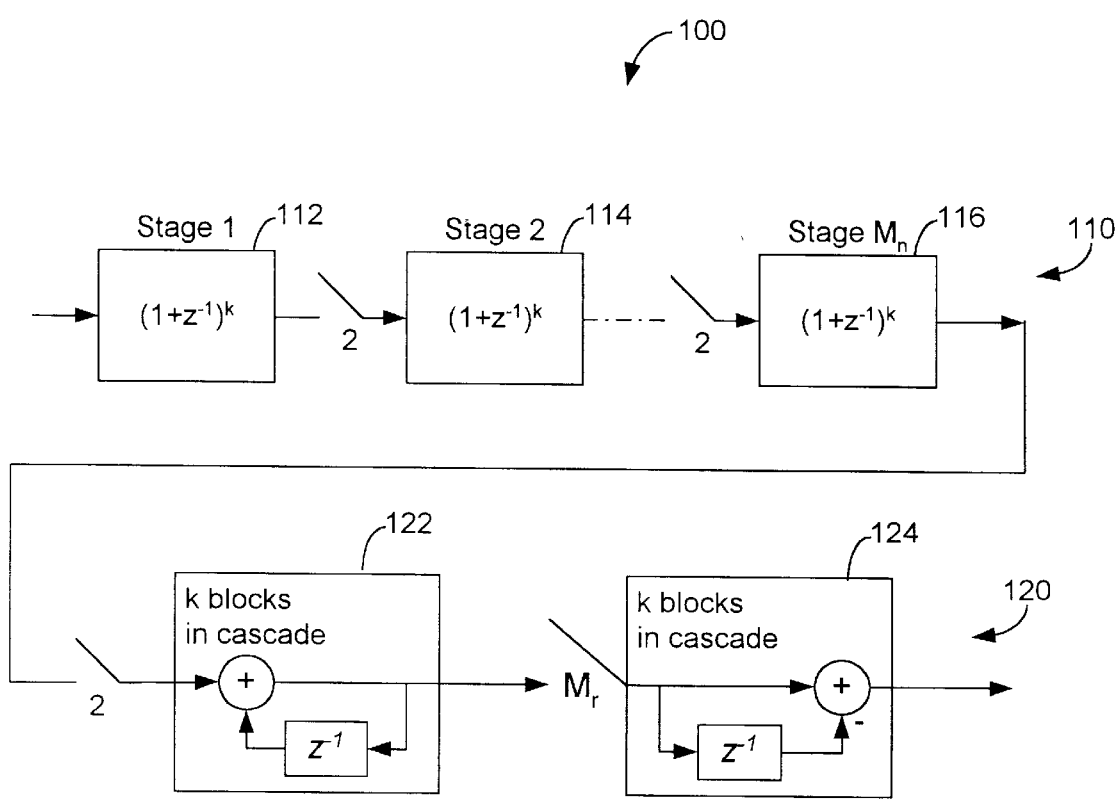
FIG. 4 a block diagram illustrating a decimation filter constructed in accordance with the present invention.

Turning now to the drawings, reference is made to FIG. 4, which shows a decimation filter 100 constructed in accordance with the present invention. In short, the decimation filter 100 comprises one or more cascaded non-recursive filters 110 and a cascaded recursive filter 120. The non-recursive filters 110 and the recursive filter 120 may be implemented in a manner that is known in the prior art. The novel aspect of the present invention is the combination of the two to form a single decimator.

More particularly, a plurality of non-recursive filters 112, 114, and 116 may be cascaded at the front end of the decimator 100, while the recursive filter 122, 124 is disposed at the back end of the decimator 100. The non-recursive filter stages 112, 114, and 116 have been illustrated generically as $M_n$ stages. It will be appreciated that one, two, or any practical number of stages may be implemented, depending upon the particular application and design goals. In the apparatus of the preferred embodiment, two non-recursive stages are implemented.

Each non-recursive stage is illustrated as being defined by the transfer function $H(z)=(1+z^{-1})^k$, where $z^{-1}$ represents a delay and k is the order of the decimation filter. The numeral "2" separating the stages indicates a reduction in data rate by a factor of 2–i.e, the decimation ratio for each stage in the non-recursive part is 2. It will therefore be appreciated that as non-recursive stages are cascaded, the overall decimation will be a power of two (e.g., $2^{M_n}$). It will be appreciated that, consistent with the concepts and teachings of the present invention, that the various non-recursive stages of the decimator may be defined by other transfer functions, in addition to the one set out above. Furthermore, the transfer function defining the various non-recursive stages may be identical to one another, or they may differ, depending upon the application and design goals.

Likewise, the recursive filter 120 may be implemented in various manners. A commonly known manner, and the manner illustrated, is to implemented it with an IIR filter 122 followed by an FIR filter 124. As illustrated, the IIR filter is characterized by a feedback component, while the FIR filter is characterized by a feed-forward component. By placing k blocks in cascade, a $k^{th}$ order filter may be obtained.

Assume that there are $M_n$ non-recursive stages, and a data reduction (decimation rate) of two for each stage. Further assume that there is a decimation rate of $M_n$ for the recursive filter. The overall decimation rate is $2^{M_n} \cdot M_r$. Therefore, the filter transfer function may be characterized by the following equation:

$$H(z) = \left\{\frac{1-z^{-n}}{1-z^{-1}}\right\}^k = \quad \text{(Equation 5)}$$

$$\left\{\frac{1-z^{-2^{M_n} \cdot M_r}}{1-z^{-1}}\right\}^k = \left\{\frac{1-z^{-2^{M_n}}}{1-z^{-1}}\right\} \cdot \left\{\frac{1-z^{-2^{M_n} \cdot M_r}}{1-z^{-2^{M_n}}}\right\}^k.$$

Segmenting the equation in this manner, the first portion of the equation may be implemented by the non-recursive architecture of filter 110. Utilizing the non-recursive architecture to implement this equation results in a significant power saving, than if a recursive filter were placed on the front end. The second portion of the equation may be realized by the recursive architecture of filter 120. This facilitates the programmability of the overall filter design, by allowing the recursive decimation rate $M_r$ to be programmably adjusted.

Equation 5 may be rearranged as follows:

$$H(z) = \left\{\prod_{i=0}^{M_n-1}\{1+z^{-2^i}\}^k\right\} \cdot \left\{\frac{1}{1-(z^{-2^{M_n}})}\right\} \cdot \left\{1-(z^{-2^{M_n}})^{M_r}\right\}^k, \quad \text{(Equation 6)}$$

whereby it is observed that the second (recursive) portion may operate at a reduced data rate.

One advantage of the present invention is that it does not have the feedback at high data rate that is associated with a purely recursive decimator and therefore higher speed operation is possible. By placing the non-recursive decimator at the front end, then the high frequency, oversampled signal is adequately decimated before encountering the delay associate with the feedback of the recursive decimator. The feedback delay of the recursive decimator, encountered at the back end of the apparatus, does not adversely impact the operating speed of the overall decimation.

Another advantage of the present invention is that it consumes much less power than a purely recursive decimator, since the data length is short at high data rate and the data rata is reduced (decimated) as soon as possible at high frequencies.

Still another advantage of the present invention is that the recursive decimator at the back end of the apparatus allows for more flexibility in the decimation ratio, rather then merely allowing decimation ratios that are a power of two, like a purely non-recursive decimator. It also requires less chip area than if only the non-recursive part is used to decimate by a large factor.

Yet another advantage of the present invention is that it requires less memory and therefore less chip space than a look-up table decimator.

The foregoing description has been presented for purposes of illustration and description. It is not intended to be exhaustive or to limit the invention to the precise forms disclosed. Obvious modifications or variations are possible in light of the above teachings. The embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. An apparatus for decimating a signal comprising:
   at least one non-recursive decimator, the at least one non-recursive decimator configured to receive an oversampled input signal having a first sampling frequency and generate an output having a second sampling frequency;
   a recursive decimator, the recursive decimator configured to receive the output of the at least one non-recursive decimator and generate an output having third sampling frequency;
   wherein the recursive decimator is configured to decimate the input signal by a factor of $M_r$ according to the equation $$\left\{\frac{1-z^{-2^{M_n}\cdot M_r}}{1-z^{-2^{M_n}}}\right\}^k,$$

wherein $z^{-Mn}$ represents an Mn unit delay or one unit delay if the clock frequency is reduce to 1/Mn of the original clock frequency, and k is a filter order.

2. The apparatus as defined in claim 1, further including a plurality of non-recursive decimators.

3. The apparatus as defined in claim 2, wherein each decimator of the plurality of non-recursive decimators are identically configured.

4. The apparatus as defined in claim 2, wherein each of the plurality of non-recursive decimators is configured to decimate the input signal according to the equation $(1+z^{-1})^k$, wherein $z^{-1}$ represents a delay and k is a filter order.

5. The apparatus as defined in claim 1, wherein the at least one non-recursive decimator is configured to decimate the input signal by a factor of 2 according to the equation $(1+z^{-1})^k$, wherein $z^{-1}$ represents a delay and k is a filter order.

6. An apparatus for decimating a signal comprising:
 a plurality of non-recursive decimators, each non-recursive decimator configured to receive an oversampled input signal having a first sampling frequency and generate an output having a second sampling frequency, wherein each of the non-recursive decimators is configured to decimate the input signal according to the equation $(1+z^{-1})^k$, wherein $z^{-1}$ represents a delay and k is a filter order;
 a recursive decimator, the recursive decimator configured to receive the output of the at least one non-recursive decimator and generate an output having third sampling frequency, wherein the recursive decimator is configured to decimate the input signal by a factor of $M_r$ according to the equation $$\left\{\frac{1-z^{-2^{M_n}\cdot M_r}}{1-z^{-2^{M_n}}}\right\}^k,$$

wherein $z^{-Mn}$ represents an Mn unit delay, or one unit delay if the clock frequency is reduce to 1/Mn of the original clock frequency, and k is a filter order, wherein the apparatus is configured to decimate the input signal by a factor of $2^{Mn}\cdot M_r$ according to the following equation:

$$H(z)=\left\{\prod_{i=0}^{M_n-1}\left\{1+z^{-2^i}\right\}^k\right\}\cdot\left\{\frac{1}{1-\left(z^{-2^{M_n}}\right)}\right\}\cdot\left\{1-\left(z^{-2^{M_n}}\right)^{M_r}\right\}^k.$$

7. The apparatus as defined in claim 6, wherein $M_n$ is 2, k=5, $M_r$ is programmable.

8. A method for decimating an oversampled signal comprising the steps of:
 (a) decimating the oversampled signal in accordance with a non-recursive decimation algorithm to generate an interim decimated signal; and
 (b) decimating the interim decimated signal in accordance with a recursive decimation algorithm to generate a final decimated signal; wherein the recursive decimation algorithm is configured to decimate the input signal by a factor of $M_r$ according to the equation $$\left\{\frac{1-z^{-2^{M_n}\cdot M_r}}{1-z^{-2^{M_n}}}\right\}^k,$$

wherein $z^{-Mn}$ represents an Mn unit delay or one unit delay if the clock frequency is reduce to 1/Mn of the original clock frequency, and k is a filter order.

9. The method as defined in claim 8, further including the step of repeating step (a) a predetermined number of times, before executing step (b).

10. The method as defined in claim 8, wherein the non-recursive decimation of step (a) decimates the oversampled signal by a factor of 2 in accordance with an algorithm defined by the following equation: $(1+z^{-1})^k$.

11. The method as defined in claim 10, further including the step of repeating step (a), so that the oversampled signal is decimated by a factor of $M_n$ in accordance with an algorithm defined by the following equation:

$$H(z)=\left\{\prod_{i=0}^{M_n-1}\left\{1+z^{-2^i}\right\}^k\right\}.$$

12. The method as defined in claim 8, wherein the recursive decimation of step (b) decimates the interim decimated signal in accordance with an algorithm defined by the following equation:

$$H(z)=\left\{\frac{1}{1-\left(z^{-2^{M_n}}\right)}\right\}\cdot\left\{1-\left(z^{-2^{M_n}}\right)^{M_r}\right\}^k.$$

13. A method for decimating an oversampled signal comprising the steps of:
 (a) decimating the oversampled signal in accordance with a non-recursive decimation algorithm by a factor of 2 in accordance with an algorithm defined by the following equation: $(1+z^{-1})^k$, to generate an interim decimated signal;
 (b) decimating the interim decimated signal in accordance with a recursive decimation algorithm to generate a final decimated signal;
  further including the step of repeating step (a), so that the oversampled signal is decimated by a factor of $M_n$ in accordance with an algorithm defined by the following equation:

$$H(z)=\left\{\prod_{i=0}^{M_n-1}\left\{1+z^{-2^i}\right\}^k\right\},$$

wherein the recursive decimation of step (b) decimates the interim decimated signal by a factor or $M_r$ in accordance with an algorithm defined by the following equation:

$$H(z)=\left\{\frac{1}{1-\left(z^{-2^{M_n}}\right)}\right\}\cdot\left\{1-\left(z^{-2^{M_n}}\right)^{M_r}\right\}^k,$$

so that the overall decimation in performed in accordance with the following equation:

$$H(z) = \left\{ \prod_{i=0}^{M_n-1} \{1 + z^{-2}\}^k \right\} \cdot \left\{ \frac{1}{1 - (z^{-2M_n})} \right\} \cdot \left\{ 1 - (z^{-2M_n})^{M_r} \right\}^k.$$

14. An apparatus for decimating an oversampled signal comprising a processor having logic defined to decimate the oversampled signal in accordance with a non-recursive decimation algorithm to generate an interim decimated signal, and then to decimate the interim decimated signal in accordance with a recursive decimation algorithm to generate a final decimated signal, wherein the recursive decimation algorithm is configured to decimate the input signal by a factor of $M_r$ according to the equation $$\left\{ \frac{1 - z^{-2^{M_n} \cdot M_r}}{1 - z^{-2^{M_n}}} \right\}^k,$$

wherein $z^{-M_n}$ represents an Mn unit delay, or one unit delay if the clock frequency is reduce to 1/Mn of the original clock frequency, and k is a filter order.

15. An apparatus for decimating a signal comprising:
at least two non-recursive decimators disposed in immediate succession, wherein a first of the at least two non-recursive decimators is configured to receive an oversampled input signal having a first sampling frequency and wherein a last non-recursive decimator of the at least two non-recursive decimators generates an output having a second sampling frequency;
at least one recursive decimator, the at least one recursive decimator configured to receive the output of the last non-recursive decimator and generate an output having third sampling frequency.

16. An apparatus for decimating a signal comprising:
at least one non-recursive decimator, the at least one non-recursive decimator configured to receive an oversampled input signal having a first sampling frequency and generate an output having a second sampling frequency;
at least two recursive decimators disposed in immediate succession, wherein a first of the at least two recursive decimators is configured to receive the output of the at least one non-recursive decimator and wherein a last recursive decimator of the at least two recursive decimators generates an output having third sampling frequency.

17. An apparatus for decimating a signal comprising:
at least two non-recursive decimators disposed in immediate succession, wherein a first of the at least two non-recursive decimators is configured to receive an oversampled input signal having a first sampling frequency and wherein a last non-recursive decimator of the at least two non-recursive decimators generates an output having a second sampling frequency;
at least two recursive decimators disposed in immediate succession, wherein a first of the at least two recursive decimators is configured to receive the output of the last non-recursive decimator, and wherein a last recursive decimator of the at least two recursive decimators generates an output having third sampling frequency.

* * * * *